United States Patent
Takano et al.

(10) Patent No.: US 8,530,876 B2
(45) Date of Patent: Sep. 10, 2013

(54) SEMICONDUCTOR MEMORY DEVICE AND METHOD OF MANUFACTURING THE SAME

(75) Inventors: Kensuke Takano, Yokohama (JP); Katsuyuki Sekine, Yokkaichi (JP); Yoshio Ozawa, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 396 days.

(21) Appl. No.: 12/885,038

(22) Filed: Sep. 17, 2010

(65) Prior Publication Data

US 2011/0193050 A1    Aug. 11, 2011

(30) Foreign Application Priority Data

Feb. 9, 2010   (JP) .................................. 2010-026867

(51) Int. Cl.
*H01L 21/00*   (2006.01)
(52) U.S. Cl.
USPC ............................... 257/4; 438/382; 365/148
(58) Field of Classification Search
USPC ............................... 257/4; 438/382; 365/148
See application file for complete search history.

(56) References Cited

U.S. PATENT DOCUMENTS

| | | | | |
|---|---|---|---|---|
| 6,998,697 | B2* | 2/2006 | Campbell et al. | 257/529 |
| 2009/0283736 | A1* | 11/2009 | Kanzawa et al. | 257/2 |

OTHER PUBLICATIONS

H.Y. Lee et al., "Low Power and High Speed Bipolar Switching with a Thin Reactive Ti Buffer Layer in Robust $HfO_2$ Based RRAM", IEDM Technology Digest, 2008, 4 pages.
B. Gao et al., "Oxide-Based RRAM: Uniformity Improvement Using a New Material-Oriented Methodology", Symposium on VLSI Technology Digest of Technical Papers, 2009, 2 pages.

* cited by examiner

*Primary Examiner* — Julio J Maldonado
*Assistant Examiner* — Robert Bachner
(74) *Attorney, Agent, or Firm* — Oblon, Spivak, McClelland, Maier & Neustadt, L.L.P.

(57) ABSTRACT

According to one embodiment, a semiconductor memory device comprises a substrate, a lower electrode, a variable resistance film, and an upper electrode. The lower electrode is on the substrate. The variable resistance film is on the lower electrode and stores data. The upper electrode is on the variable resistance film. The variable resistance film comprises a first film, and a second film. The first film is on a side of at least one of the upper electrode and the lower electrode and contains a metal. The second film is between the first film and the other electrode and contains the metal and oxygen. A composition ratio [O]/[Me] of oxygen to the metal in the second film is lower than a stoichiometric ratio and higher than the composition ratio [O]/[Me] in the first film. The composition ratio [0]/[Me] changes between the first film and the second film.

9 Claims, 9 Drawing Sheets

SEMICONDUCTOR MEMORY DEVICE AND METHOD OF MANUFACTURING THE SAME

CROSS-REFERENCE TO RELATED APPLICATIONS

This application is based upon and claims the benefit of priority from Japanese Patent Application No. 2010-026867, filed Feb. 9, 2010; the entire contents of which are incorporated herein by reference.

FIELD

Embodiments described herein relate generally to a semiconductor memory device including a filament-operation-type variable resistance film and a method of manufacturing the same.

BACKGROUND

A resistance-change memory (resistive random access memory [ReRAM]) has been proposed as a memory element that uses the resistance switching phenomenon of a variable resistance film formed between upper and lower electrodes in information recording. An example of the ReRAM is a filament-operation-type memory using a transition metal oxide as the variable resistance film. In this filament-operation-type ReRAM, a thin conduction path (filament) is formed in order to perform switching with a low current. To form the filament, however, it is necessary to divisionally apply a voltage little by little a plurality of number of times in initialization (forming) of the element. Therefore, the forming before the shipment of the product takes a long time, and this interferes with the shipment of the product. To prevent this, attempts have been made to shorten the forming time by using a variable resistance film that facilitates forming.

"IEDM Tech. Dig., p. 297, 2008" describes the technique of lowering the forming voltage by thinning the variable resistance film. More specifically, a thin transition metal oxide deposited by chemical vapor deposition (CVD) method and having a thickness of about 5 nm or less is used as the variable resistance film. In this method, however, as the film thickness decreases, it becomes difficult to form a metal-rich film (a film in which the composition ratio [O]/[Me] of oxygen to a metal is lower than the stoichiometric ratio) necessary for a stable switching operation. That is, "IEDM Tech. Dig., p. 297, 2008" can lower the forming voltage, but cannot obtain stable switching characteristics (switching yield and durability [endurance characteristics]).

Also, "Symposium on VLSI Technology, p. 30, 2009" describes the method of forming a variable resistance film by metal sputtering and thermal oxidation following the sputtering. More specifically, a metal film is formed by metal sputtering and oxidized by thermal oxidation. A thin transition metal oxide thus formed and having a thickness of about 5 nm or less is used as the variable resistance film. When forming the variable resistance film (metal oxide film) by thermal oxidation, however, the lower portion (near the interface with a lower electrode) of the variable resistance film is readily oxidized. This degrades the adhesion between the variable resistance film and lower electrode. That is, in "Symposium on VLSI Technology, p. 30, 2009", a metal-rich film is obtained by controlling thermal oxidation, but film peeling readily occurs in the interface between the variable resistance film and lower electrode. In addition, in the method using thermal oxidation, the oxygen amount in the direction of film thickness is difficult to control. Therefore, a film is relatively uniformly oxidized toward the depth of the film. This makes a low-current switching operation difficult.

DETAILED DESCRIPTION

In general, according to one embodiment, a semiconductor memory device comprises a substrate, a lower electrode, a variable resistance film, and an upper electrode. The lower electrode is on the substrate. The variable resistance film is on the lower electrode and stores data in the form of an electrically programmable resistance. The upper electrode is on the variable resistance film. The variable resistance film comprises a first film, and a second film. The first film is on a side of at least one of the upper electrode and the lower electrode and contains a metal. The second film is between the first film and the other electrode and contains the metal and oxygen. A composition ratio [O]/[Me] of oxygen to the metal in the second film is lower than a stoichiometric ratio and higher than the composition ratio [O]/[Me] in the first film. The composition ratio [O]/[Me] changes between the first film and the second film.

Embodiments will be explained below with reference to the accompanying drawing. In the drawing, the same reference numbers denote the same parts.

Note that in the following embodiments, an explanation of the same features will be omitted, and different points will be explained in detail.

<First Embodiment>

The first embodiment is an example in which a variable resistance film is a multilayered film ($MeO_x$/Me multilayered film) including a metal oxide film and metal film.

[Structure]

Figure 1A:
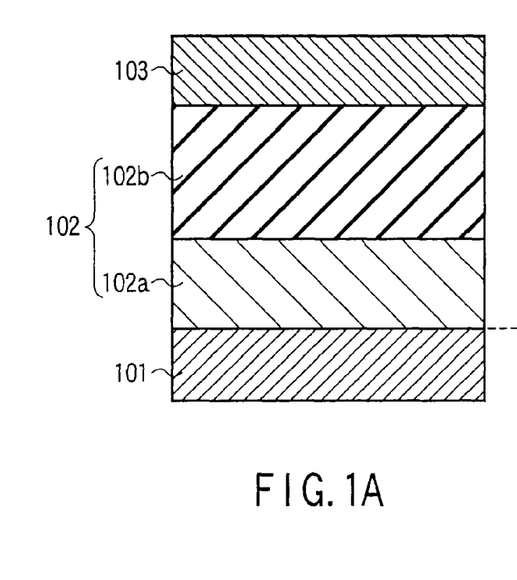
FIGS. 1A, 1B, and 1C are views showing the arrangement of a memory element according to the first embodiment.
Figure 1B:
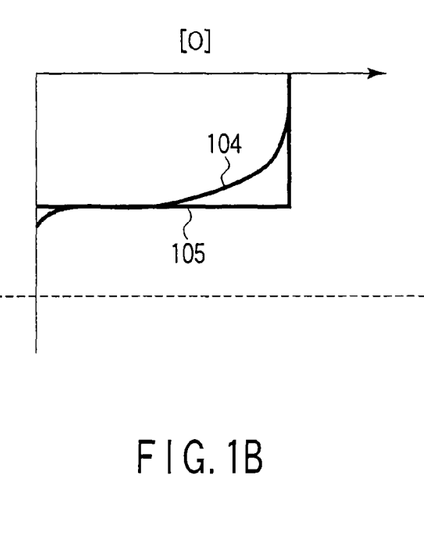
Figure 1C:
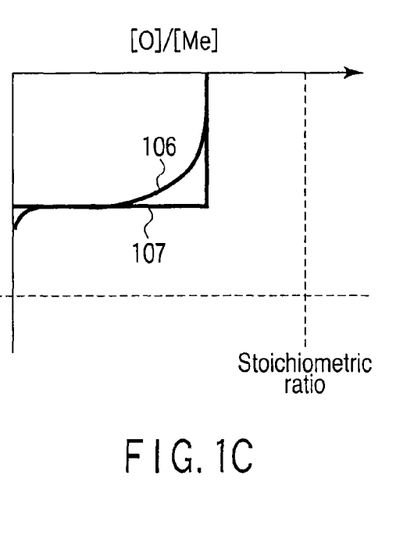

First, the structure of a semiconductor memory device according to the first embodiment will be explained below with reference to FIGS. 1A to 1C. FIGS. 1A to 1C illustrate the arrangement of a memory element and the composition ratio of the variable resistance film according to the first embodiment.

As shown in FIG. 1A, the memory element according to this embodiment includes a lower electrode 101, variable resistance film 102, and upper electrode 103.

The lower electrode 101 is formed on a substrate (not shown). The variable resistance film 102 is formed on the lower electrode 101. The resistance of the variable resistance film 102 changes when a current flows. The variable resistance film 102 stores data in the form of this electrically programmable resistance. The upper electrode 103 is formed on the variable resistance film 102.

The variable resistance film 102 of this embodiment includes a metal film 102a and metal oxide film 102b. The metal film 102a is formed on the lower electrode 101. The metal oxide film 102b is formed on the metal film 102a. The metal film 102a and metal oxide film 102b are made of the same metal. Also, as shown in FIG. 10, the composition ratio [O]/[Me] of oxygen to the metal in the metal oxide film 102b is set lower than the stoichiometric ratio (metal rich) and higher than the composition ratio [O]/[Me] of oxygen to the metal in the metal film 102a, in order to improve the switching characteristics.

As shown in FIG. 1B, the oxygen concentration in the variable resistance film 102 abruptly changes in the interfaces with the metal film 102a and metal oxide film 102b. More specifically, in the vicinity of the interface between the metal film 102a and metal oxide film 102b, the oxygen concentration may have a profile that abruptly curvedly increases from the metal film 102a toward the metal oxide film 102b as indicated by reference number 104 in FIG. 1B, or a step-function-like profile that changes step by step as indicated by reference number 105 in FIG. 1B. That is, a region which has a certain film thickness and in which the oxygen concentration is almost zero exists in the metal film 102a, and a region which has a certain film thickness and in which the oxygen concentration is higher than that in the metal film 102a exists in the metal oxide film 102b. The range within which the composition ratio of oxygen to the metal is constant is the same as the oxygen concentration.

Note that as the lower electrode 101 and upper electrode 103, it is desirable to use, e.g., a metal such as W, Ta, or Cu, a nitride or carbide such as TiN, TaN, or WC, or heavily doped silicon (silicon having a high impurity concentration). Also, a transition metal oxide can be used as the variable resistance film 102 (metal oxide film 102b). As the transition metal oxide, it is possible to use, e.g., a binary metal oxide represented by $M_xO_y$ (where M represents a metal and O represents oxygen), or a ternary metal oxide represented by $A_\alpha M_\beta O_\gamma$ (where A and M represent metals and O represents oxygen). However, this embodiment is not limited to this, and it is also possible to use a quaternary metal oxide or a higher-order metal oxide. As the transition metal element, it is possible to use a divalent metal element for which the oxide is represented by, e.g., NiO or CoO, a trivalent metal element for which the oxide is represented by, e.g., $Al_2O_3$, a tetravalent metal element for which the oxide is represented by, e.g., $TiO_2$, $HfO_2$, or $ZrO_2$, or a pentavalent metal element for which the oxide is represented by, e.g., $Ta_2O_5$.

[Manufacturing Method]

A method of manufacturing the semiconductor memory device according to the first embodiment will be explained below with reference to FIGS. 2A to 2F. FIGS. 2A to 2F illustrate the steps of manufacture of the memory element according to the first embodiment.

Figure 2A:
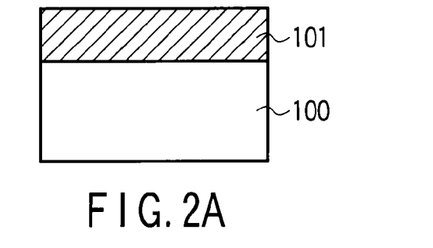
FIGS. 2A, 2B, 2C, 2D, 2E, and 2F are sectional views showing the steps of manufacturing a semiconductor memory device according to the first embodiment.

First, as shown in FIG. 2A, a lower electrode 101 is formed on a substrate 100. The substrate 100 is, e.g., a semiconductor substrate on which various control circuits are formed. When stacking a plurality of memory elements, the substrate 100 is a memory element below a memory element of interest. The lower electrode 101 is formed by depositing the above-mentioned material by using, e.g., sputtering. However, this embodiment is not limited to this, and it is also possible to use CVD method or atomic layer deposition (ALD) method.

Figure 2B:
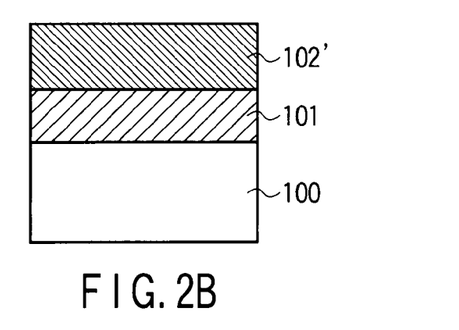

Then, as shown in FIG. 2B, a transition metal film 102' serving as a variable resistance film 102 later is formed on the lower electrode 101. The transition metal film 102' is formed by, e.g., metal sputtering, metal deposition, metal CVD method, or a metal plating process.

Figure 2C:
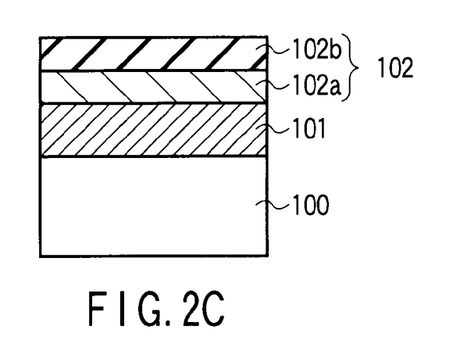

Subsequently, as shown in FIG. 2C, the surface of the transition metal film 102' is oxidized to form a variable resistance film 102 including a metal film 102a and metal-rich metal oxide film 102b. In this step, radical oxidation by oxygen plasma is used. Consequently, a profile in which the oxygen concentration abruptly changes in the interface between the metal film 102a and metal oxide film 102b as shown in FIG. 1B is obtained.

Note that the film thickness of the metal oxide film 102b is desirably, e.g., about 5 nm or less. This is so because a filament is formed in the metal oxide film 102b by forming. However, this embodiment is not limited to this, and it is also possible to appropriately set the film thickness in accordance with the scale of peripheral circuits (not shown) formed on the substrate 100.

Figure 2D:
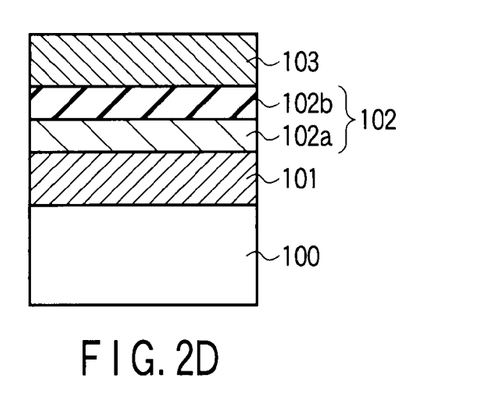

As shown in FIG. 2D, an upper electrode 103 is formed on the variable resistance film 102. Similar to the lower electrode 101, the upper electrode 103 is formed by using sputtering, CVD method, or ALD method.

Figure 2E:
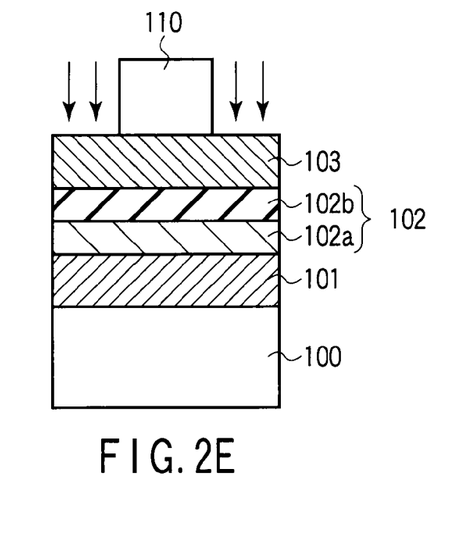

As shown in FIG. 2E, a mask 110 is formed on the upper electrode 103. The mask 110 is processed into a desired pattern by exposure and development.

Figure 2F:
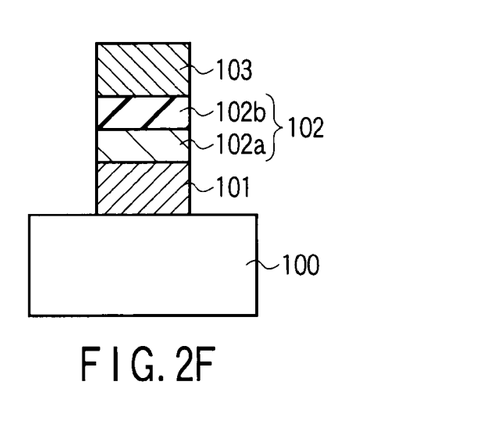

As shown in FIG. 2F, the mask 110 is used to process the memory element into the desired pattern by reactive ion etching (RIE). After that, the mask 110 is removed. In this manner, the memory element according to this embodiment is completed.

The memory element manufacturing method according to this embodiment is characterized in that the variable resistance film 102 including the metal film 102a and metal oxide film 102b is formed by oxidizing the surface of the transition metal film 102' by oxygen plasma.

Figure 3A:
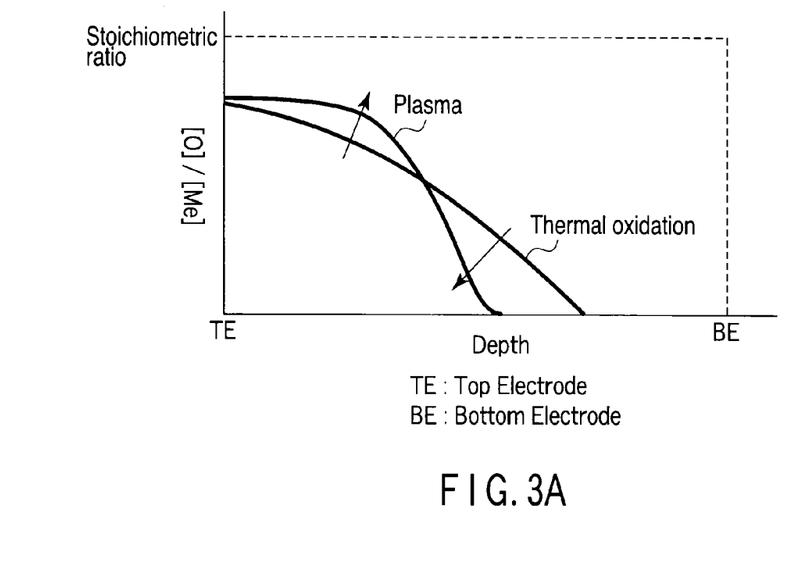
FIGS. 3A and 3B are graphs showing the composition ratio of a variable resistance film when using oxidation by oxygen plasma, in the memory element according to the first embodiment.
Figure 3B:
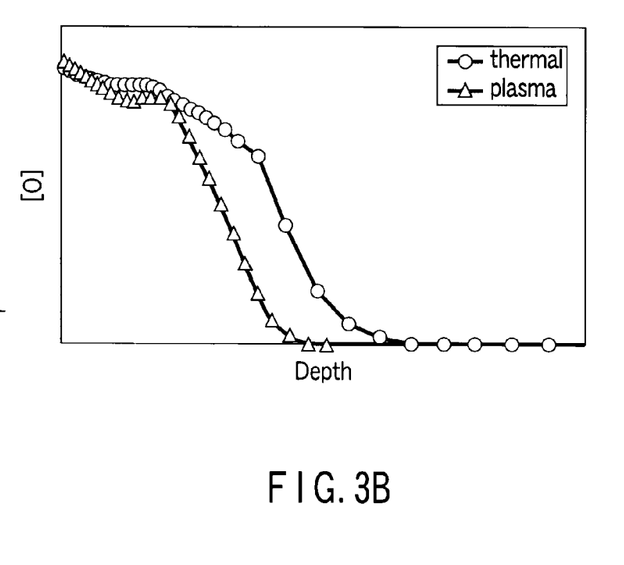

FIGS. 3A and 3B illustrate the comparison of the composition ratios of the variable resistance film 102 when using oxidation by oxygen plasma and thermal oxidation in the method of forming the variable resistance film 102 according to this embodiment. As shown in FIG. 3A, thermal oxidation diffuses oxygen to the lower portion of the variable resistance film 102. In addition, the composition ratio ([O]/[Me]) of oxygen to the metal gradually decreases from the upper surface to the lower surface. On the other hand, plasma oxidation can control the diffusion of oxygen more easily than in thermal oxidation. Therefore, the oxygen diffusion portion can be restricted to the upper portion. This makes it possible to obtain a profile in which the composition ratio [O]/[Me] abruptly decreases in the interface between the metal film 102a and metal oxide film 102b. That is, as shown in FIG. 3B, a profile in which the oxygen concentration changes more abruptly than in thermal oxidation can be obtained by plasma oxidation.

[Effects]

In the first embodiment described above, the variable resistance film 102 includes the metal film 102a and metal oxide film 102b, and the composition ratio of oxygen to the metal abruptly changes in the interface between the metal film 102a and metal oxide film 102b. More specifically, the oxygen concentration abruptly decreases from the metal oxide film 102b toward the metal film 102a. Also, a region where the oxygen concentration is uniform in the film thickness direction exists in the metal oxide film 102b. That is, a high-oxygen-concentration region having a certain film thickness exists. Accordingly, a highly insulating region spreads in a portion of the metal oxide film 102b except for the filament. In a switching operation, therefore, it is possible to concentrate a current to the filament portion, and perform a low-current operation. Note that even when the high-oxygen-concentration region exists in the metal oxide film 102b, if the film thickness of the region is too small, no sufficient insulation properties can be obtained in the portion except for the filament. This makes a low-current operation difficult. Accordingly, the film thickness of the high-oxygen-concentration region is desirably, e.g., 2 nm or more with respect to 5 nm as the film thickness of the metal oxide film 102b.

Also, the metal film 102a requires no forming because the resistance is sufficiently low. Therefore, the metal oxide film 102b is the only portion requiring forming. In this embodiment, the diffusion of oxygen can be restricted to the upper portion of the variable resistance film 102. This makes it possible to decrease the film thickness of the metal oxide film 102b requiring forming. Consequently, it is possible to lower the forming voltage and shorten the forming time.

Generally, stable switching characteristics are presumably obtained when a metal oxide film having a composition richer in metal than the stoichiometric ratio exists in the anode interface. In this embodiment, the metal oxide film 102b richer in metal than the stoichiometric ratio is formed in, e.g., the anode interface as the upper electrode. Therefore, stable switching characteristics are obtained.

Furthermore, in the manufacturing method of this embodiment, the variable resistance film 102 including the metal film 102a and metal oxide film 102b is formed by oxidizing the surface of the transition metal film 102' by oxygen plasma. Oxidation by oxygen plasma can readily control the oxygen diffusion region in the transition metal film 102'. This makes it possible to suppress oxygen from diffusing to the interface between the metal film 102a and lower electrode 101. Accordingly, degradation of the adhesion between the metal film 102a and lower electrode 101 can be reduced more than that when performing thermal oxidation. This increases the film peeling margin against the diffusion of oxygen in a later heating step or the like, thereby suppressing film peeling during the process.

In addition, oxidation by oxygen plasma can be performed at a relatively low temperature of, e.g., about 100° C. Therefore, the influence of heat on the device can be reduced, and as a consequence the device characteristics can be improved.

Figure 4:
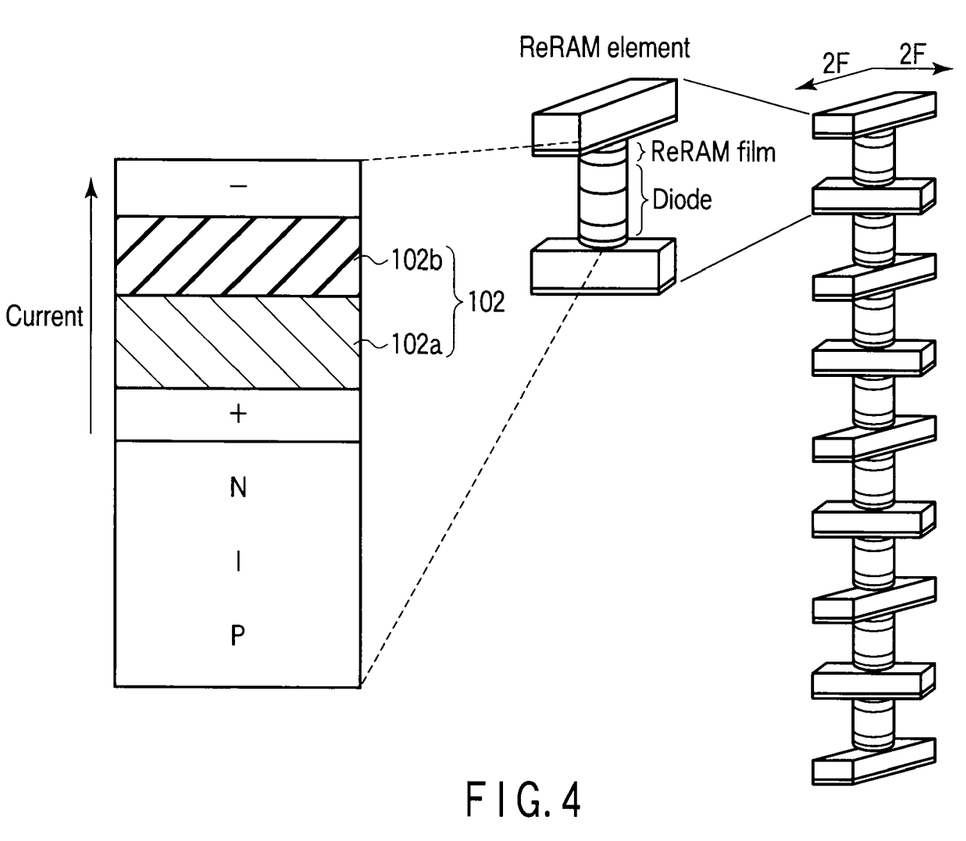
FIG. 4 is a view showing an application example of the memory element according to the first embodiment.

Note that FIG. 4 shows an example in which the memory element according to this embodiment is applied to a cross-point cell. As shown in FIG. 4, when using the variable resistance film 102 in an ReRAM element using a PIN diode, it is desirable to form the metal film 102a on the anode side and the metal oxide film 102b on the cathode side in order to improve the switching characteristics. That is, the resistance element is desirably set such that a current flows from the metal film 102a to the metal oxide film 102b. As shown in FIG. 4, therefore, the N layer of the diode is formed in contact with the anode. In the cross-point cell, the directions of the PIN diodes (the directions of currents) in layers are alternately opposite, in order to reduce the number of steps. Accordingly, the structures of the variable resistance films 102 in layers are desirably alternately formed in opposite directions.

<Second Embodiment>

In the first embodiment, the variable resistance film is the multilayered film including the metal-rich metal oxide film and metal film. On the other hand, the second embodiment is an example in which a variable resistance film is a multilayered film ($MeO_x1/MeO_x2$ multilayered film) including a metal-rich metal oxide film and a metal oxide film richer in metal than the former metal oxide film.

[Structure]

Figure 5A:
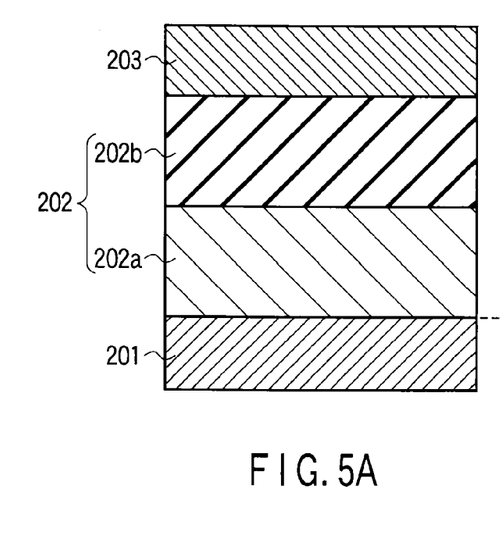
FIGS. 5A, 5B, and 5C are views showing the arrangement of a memory element according to the second embodiment.
Figure 5B:
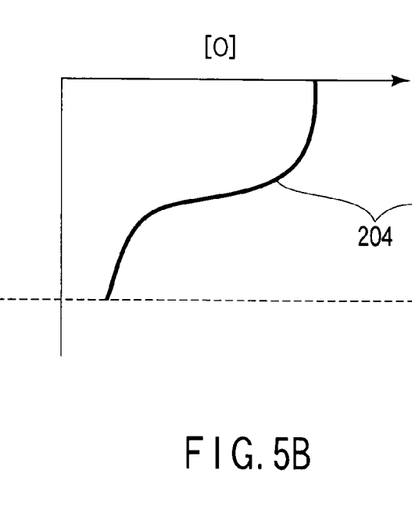
Figure 5C:
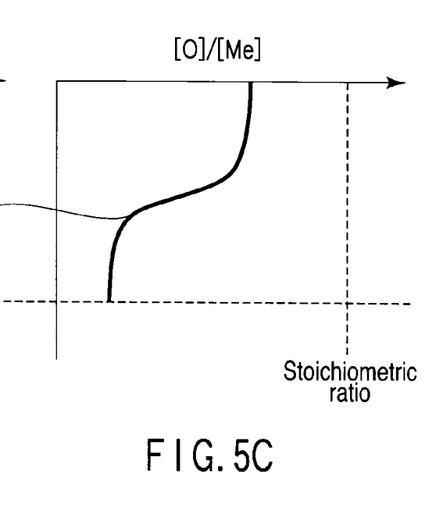

First, the structure of a semiconductor memory device according to the second embodiment will be explained below with reference to FIGS. 5A to 5C. FIGS. 5A to 5C illustrate the arrangement of a metal element and the composition ratio of the variable resistance film according to the second embodiment.

As shown in FIG. 5A, the memory element according to this embodiment includes a lower electrode 201, variable resistance film 202, and upper electrode 203. This embodiment differs from the first embodiment in that the variable resistance film 202 includes a first metal oxide film 202a and second metal oxide film 202b.

The first metal oxide film 202a is formed on the lower electrode 201. The second metal oxide film 202b is formed on the first metal oxide film 202a. The first and second metal oxide films 202a and 202b are made of the same metal. Also, as shown in FIG. 5C, the composition ratio [O]/[Me] of oxygen to the metal in the second metal oxide film 202b is lower than the stoichiometric ratio (metal rich). In addition, the composition ratio [O]/[Me] of oxygen to the metal in the first metal oxide film 202a is much lower than that in the second metal oxide film 202b. That is, the composition ratio [O]/[Me] of oxygen to the metal in the first metal oxide film 202a is low to such an extent that no film peeling occurs in the interface with the lower electrode 201.

As shown in FIG. 5B, the oxygen concentration in the variable resistance film 202 abruptly changes in the interface between the first and second metal oxide films 202a and 202b. That is, the oxygen concentration abruptly increases from the first metal oxide film 202a toward the second metal oxide film 202b. Also, a low-oxygen-concentration region having a certain film thickness exists in the first metal oxide film 202a, and a region which has a certain film thickness and in which the oxygen concentration is higher than that of the first metal oxide film 202a exists in the second metal oxide film 202b.

Note that the same transition metal oxide as that of the first embodiment can be used as the variable resistance film 202 (first and second metal oxide films 202a and 202b).

[Manufacturing Method]

A method of manufacturing the semiconductor memory device according to the second embodiment will be explained below.

First, a transition metal film is formed on a lower electrode 201 by performing the steps shown in FIGS. 2A and 2B of the first embodiment. After that, the surface of the transition metal film is oxidized to form a variable resistance film 202 including a first metal oxide film 202a and second metal oxide film 202b. In this step, the variable resistance film 202 having the above-mentioned multilayered structure is formed by performing radical oxidation at a temperature and pressure higher than those of the first embodiment.

Alternatively, the steps shown in FIGS. 2A to 2C are performed, and annealing is performed at, e.g., about 500° C. or more after that. Consequently, oxygen diffuses to the lower portion of the variable resistance film 202, thereby forming the variable resistance film 202 having the above-mentioned multilayered structure.

After that, the same steps as those of the first embodiment are performed. That is, an upper electrode 203 is formed on the variable resistance film 202, and the memory element is processed into a desired pattern.

[Effects]

The second embodiment described above can achieve the same effects as those of the first embodiment.

In addition, the variable resistance film 202 according to this embodiment improves the data retention characteristics. The principle of this effect will be explained below.

Figure 6:
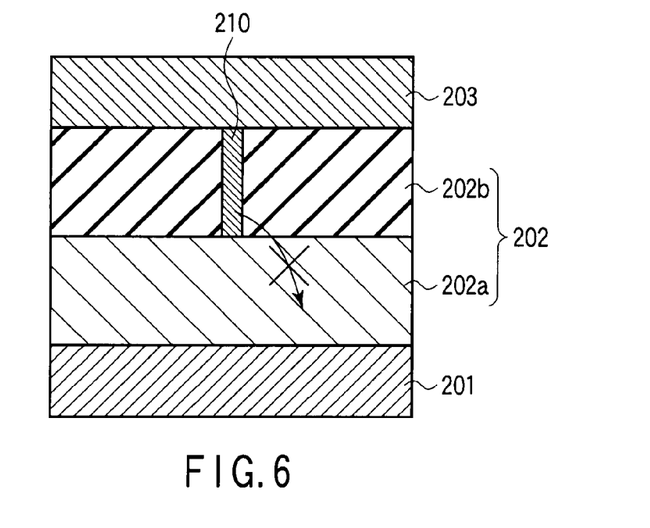
FIG. 6 is a view for explaining the effect of a semiconductor memory device according to the second embodiment.

As shown in FIG. 6, a conduction path (filament) 210 is formed in the second metal oxide film 202b of the variable resistance film 202 by forming. Electric charge is trapped in the filament 210 during forming. If this electric charge leaks from the filament 210 toward the lower electrode 201, the resistance of the filament 210 changes. This may degrade the data retention characteristics. In this embodiment, the first metal oxide film 202a containing oxygen and having a bandgap is formed between the lower electrode 201 and filament 210. This makes it possible to suppress leakage of electric charge from the filament 210, and improve the data retention characteristics.

<Third Embodiment>

The third embodiment is an example in which a variable resistance film is a multilayered film (Me/MeO$_x$/Me multilayered film) including a metal film, metal-rich metal oxide film, and metal film.

[Structure]

Figure 7A:
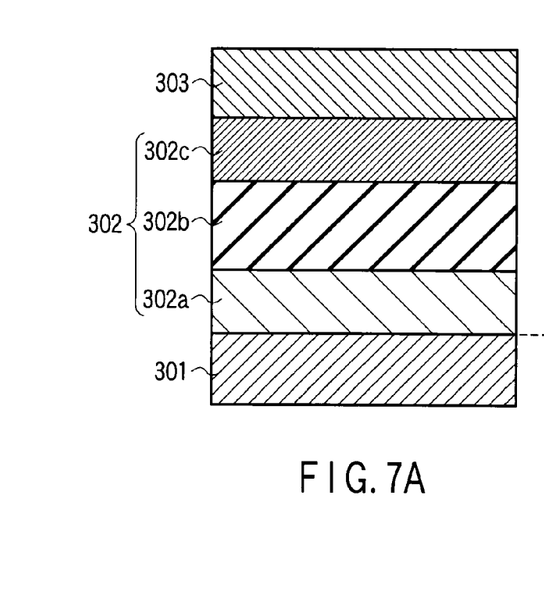
FIGS. 7A, 7B, and 7C are views showing the arrangement of a memory element according to the third embodiment.
Figure 7B:
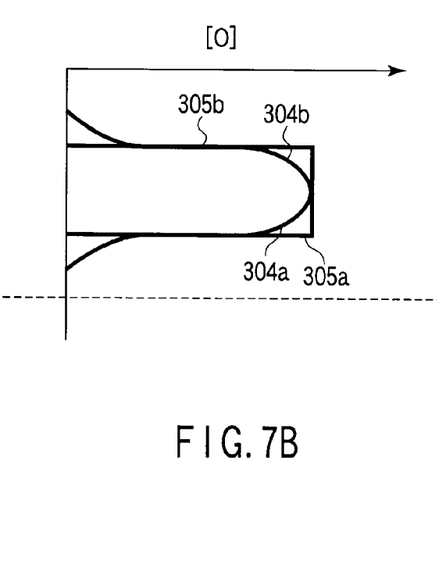
Figure 7C:
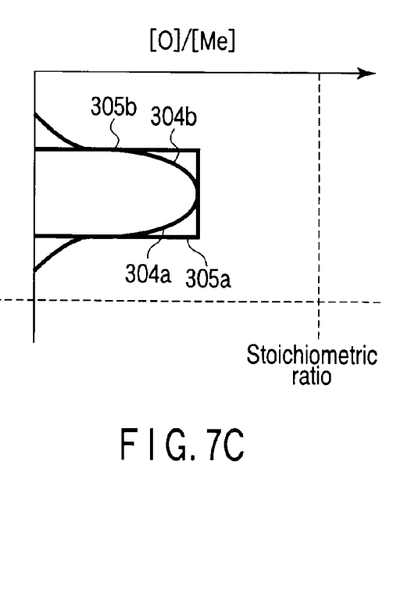

First, the structure of a semiconductor memory device according to the third embodiment will be explained below with reference to FIGS. 7A to 7C. FIGS. 7A to 7C illustrate the arrangement of a memory element and the composition ratio of the variable resistance film according to the third embodiment.

As shown in FIG. 7A, the memory element according to this embodiment includes a lower electrode 301, variable resistance film 302, and upper electrode 303. This embodiment differs from each of the above-mentioned embodiments in that the variable resistance film 302 includes a first metal film 302a, metal oxide film 302b, and second metal film 302c.

The first metal film 302a is formed on the lower electrode 301. The metal oxide film 302b is formed on the first metal film 302a. The second metal film 302c is formed on the metal oxide film 302b. The first metal film 302a, metal oxide film 302b, and second metal film 302c are made of the same metal. Also, as shown in FIG. 7C, the composition ratio [O]/[Me] of oxygen to the metal in the metal oxide film 302b is lower than the stoichiometric ratio. That is, in the variable resistance film 302, the first metal film 302a and second metal film 302c in which no oxygen is diffused are respectively formed on the side of the lower electrode 301 and on the side of the upper electrode 303, and the metal-rich metal oxide film 302b is formed between them. In other words, in the variable resistance film 302, oxygen locally exists in the metal oxide film 302b, and no oxygen exists in the first and second metal films 302a and 302c below and above the metal oxide film 302b.

As shown in FIG. 7B, the oxygen concentration in the variable resistance film 302 abruptly changes in the interface between the first metal film 302a and metal oxide film 302b, and in the interface between the metal oxide film 302b and second metal film 302c. More specifically, the oxygen concentration may have a profile 304a that abruptly curvedly changes near the interface between the first metal film 302a and metal oxide film 302b, and a profile 304b that abruptly curvedly changes near the interface between the metal oxide film 302b and second metal film 302c, or step-function-like profiles 305a and 305b that change step by step. Also, a region which has a certain film thickness and in which the oxygen concentration is almost zero exists in each of the first and second metal films 302a and 302c, and a region which has a certain film thickness and in which the oxygen concentration is higher than those in the first and second metal films 302a and 302c exists in the metal oxide film 302b.

[Manufacturing Method]

Figure 8A:
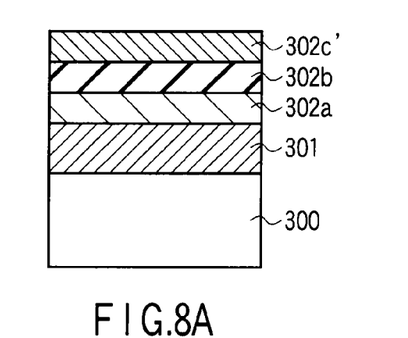
FIGS. 8A and 8B are sectional views showing the steps of manufacturing a semiconductor memory device according to the third embodiment.
Figure 8B:
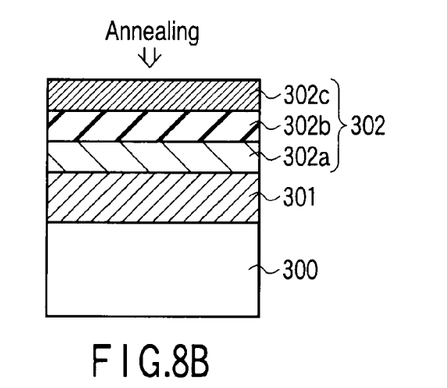

A method of manufacturing the semiconductor memory device according to the third embodiment will be explained below with reference to FIGS. 8A and 8B. FIGS. 8A and 8B illustrate the steps of manufacturing the memory element according to the third embodiment.

First, the steps shown in FIGS. 2A to 2C of the first embodiment are performed to form a first metal film 302a and metal oxide film 302b on a lower electrode 301.

Then, as shown in FIG. 8A, a transition metal film 302c' serving as a second metal film 302c is formed on the metal oxide film 302b. The transition metal film 302c' is formed by, e.g., metal sputtering, metal deposition, metal CVD method, or a metal plating process.

Subsequently, as shown in FIG. 8B, a second metal film 302c is formed by performing annealing at, e.g., about 500° C. In this manner, a variable resistance film 302 having the desired oxygen profiles as described above is formed.

After that, the same steps as those of the first embodiment are performed. That is, an upper electrode 303 is formed on the variable resistance film 302, and the memory element is processed into a desire pattern.

[Effects]

The third embodiment described above can achieve the same effects as those of the first embodiment.

In addition, the variable resistance film 302 according to this embodiment includes the second metal film 302c between the metal oxide film 302b and upper electrode 303. This makes it possible to reduce degradation of the adhesion in the interface between the variable resistance film 302 and upper electrode 303, and suppress film peeling.

<Fourth Embodiment>

The fourth embodiment is an example in which a variable resistance film is a multilayered film (MeO$_x$1/MeO$_x$2/MeO$_x$3 multilayered film) including a highly metal-rich metal oxide film, metal-rich metal oxide film, and highly metal-rich metal oxide film.

[Structure]

Figure 9A:
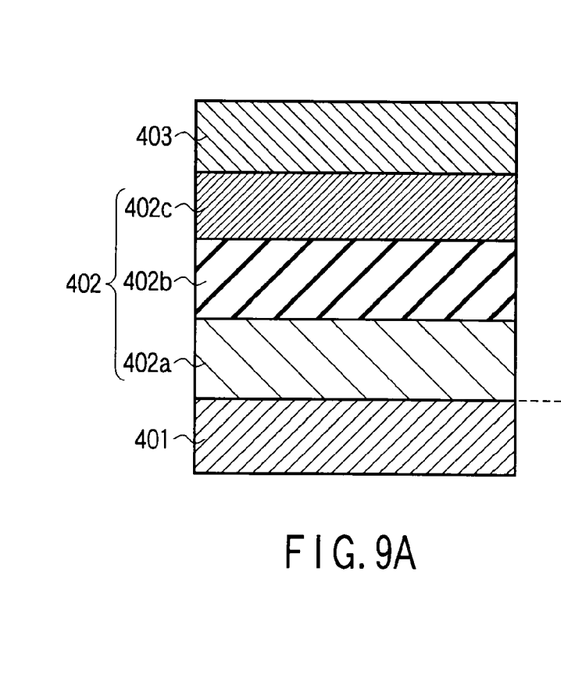
FIGS. 9A, 9B, and 9C are views showing the arrangement of a memory element according to the fourth embodiment.
Figure 9B:
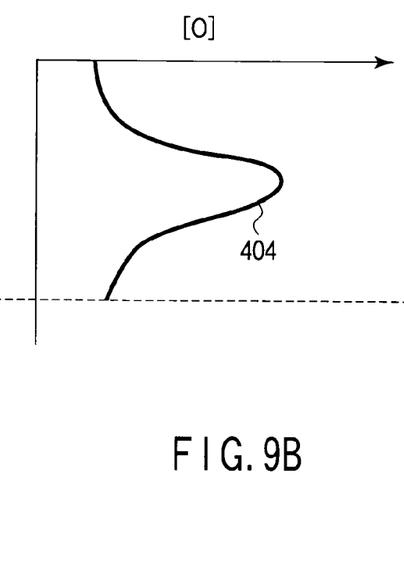
Figure 9C:
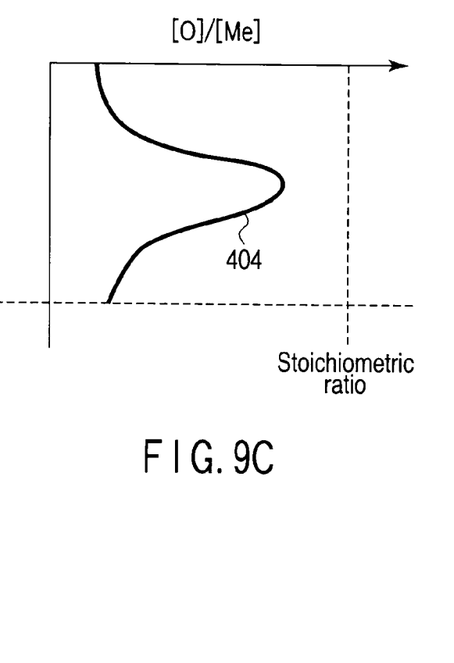

First, the structure of a semiconductor memory device according to the fourth embodiment will be explained below with reference to FIGS. 9A to 9C. FIGS. 9A to 9C illustrate the arrangement of a memory element and the composition ratio of the variable resistance film according to the fourth embodiment.

As shown in FIG. 9A, the memory element according to this embodiment includes a lower electrode 401, variable resistance film 402, and upper electrode 403. This embodiment differs from each of the above-mentioned embodiments in that the variable resistance film 402 includes a first metal oxide film 402a, second metal oxide film 402b, and third metal oxide film 402c.

The first metal oxide film 402a is formed on the lower electrode 401. The second metal oxide film 402b is formed on the first metal oxide film 402a. The third metal oxide film 402c is formed on the second metal oxide film 402b. The first, second, and third metal oxide films 402a, 402b, and 402c are made of the same metal. Also, as shown in FIG. 9C, the composition ratio [O]/[Me] of oxygen to the metal in the second metal oxide film 402b is lower than the stoichiometric ratio. In addition, the composition ratio [O]/[Me] of oxygen to the metal in each of the first and third metal oxide films 402a and 402c is much lower than that in the second metal oxide film 402b. That is, the composition ratio [O]/[Me] of oxygen to the metal in each of the first and third metal oxide films 402a and 402c is low to such an extent that no film peeling occurs in the interface with the lower electrode. More specifically, in the variable resistance film 402, the highly metal-rich first and third metal oxide films 402a and 402c are respectively formed on the lower electrode side and upper electrode side, and the metal-rich second metal oxide film 402b is formed between them.

As shown in FIG. 9B, the oxygen concentration in the variable resistance film 402 abruptly changes in the interface between the first and second metal oxide films 402a and 402b, and in the interface between the second and third metal oxide films 402b and 402c. Also, a low-oxygen-concentration region having a certain film thickness exists in each of the first and third metal oxide films 402a and 402c, and a region which has a certain film thickness and in which the oxygen concentration is higher than those in the first and third metal oxide films 402a and 402c exists in the second metal oxide film 402b.

[Manufacturing Method]

Figure 10A:
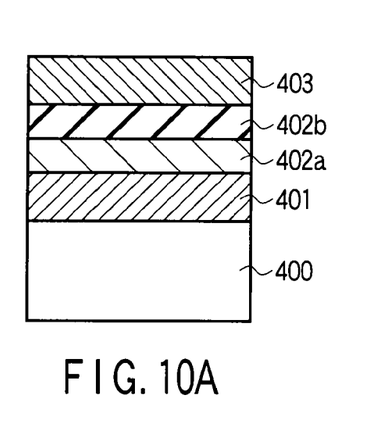
FIGS. 10A and 10B are sectional views showing the steps of manufacturing a semiconductor memory device according to the fourth embodiment.
Figure 10B:
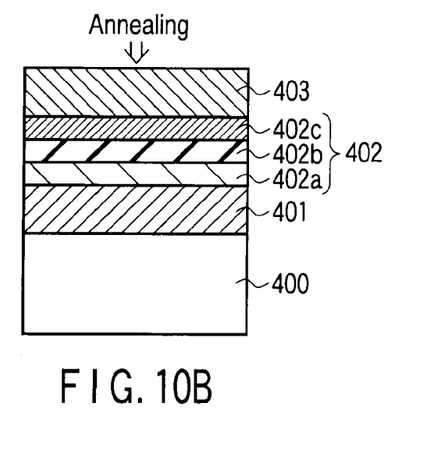

A method of manufacturing the semiconductor memory device according to the fourth embodiment will be explained below with reference to FIGS. 10A and 10B. FIGS. 10A and 10B illustrate the steps of manufacturing the memory element according to the fourth embodiment.

First, the steps shown in FIGS. 2A to 2C of the first embodiment are performed to form a first metal oxide film 402a and second metal oxide film 402b on a lower electrode 401. After that, annealing is performed at, e.g., about 500° C. or more in the same manner as in the second embodiment.

Then, as shown in FIG. 10A, an upper electrode 403 is formed on the second metal oxide film 402b.

Subsequently, as shown in FIG. 10B, the second metal oxide film 402b is annealed via the upper electrode 403. This removes oxygen from the upper portion of the second metal oxide film 402b via the upper electrode 403. Consequently, a third metal oxide film 402c having an oxygen concentration lower than that of the second metal oxide film 402b is formed on it, thereby forming a variable resistance film 402 having the above-mentioned multilayered structure.

After that, the memory element is processed into a desired pattern in the same manner as in the first embodiment.

[Effects]

The fourth embodiment described above can achieve the same effects as those of the above-mentioned embodiments.

Figure 11:
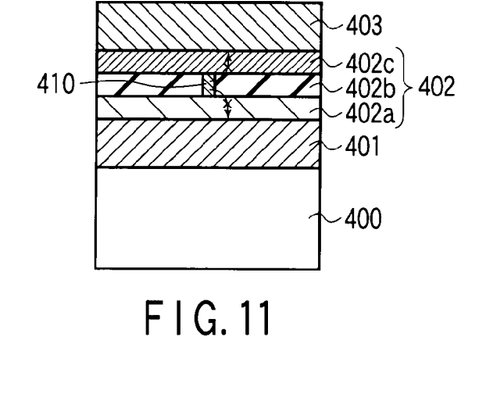
FIG. 11 is a view for explaining the effect of the semiconductor memory device according to the fourth embodiment.

In addition, the variable resistance film 402 according to this embodiment can further improve the data retention characteristics. That is, as shown in FIG. 11, the first metal oxide film 402a containing oxygen and having a bandgap is formed between the lower electrode 401 and a conduction path (filament) 410 formed in the second metal oxide film 402b. Furthermore, the third metal oxide film 402c is formed between the filament 410 and upper electrode 403. This makes it possible to suppress leakage of electric charge from the filament 410 not only to the lower electrode 401, but also to the upper electrode 403.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
a substrate;
a lower electrode on the substrate;
a variable resistance film on the lower electrode, the variable resistance film storing data in the form of an electrically programmable resistance; and
an upper electrode on the variable resistance film,
the variable resistance film comprising:
a first film on a side of at least one of the upper electrode and the lower electrode, the first film containing a metal; and
a second film between the first film and the other electrode, the second film containing the metal and oxygen; and
a third film between the second film and the other electrode, the third film containing the metal,
wherein a composition ratio [O]/[Me] of oxygen to the metal in the second film is lower than a stoichiometric ratio and higher than a composition ratio [O]/[Me] in the first film,
the composition ratio [O]/[Me] changes between the first film and the second film,
a composition ratio [O]/[Me] in the third film is lower than that in the second film, and
the composition ratio [O]/[Me] changes between the third film and the second film.

2. The device of claim 1, wherein the first film contains oxygen.

3. The device of claim 1, wherein the first film and the third film contain oxygen.

4. The device of claim 1, wherein a region in which the composition ratio [O]/[Me] is uniform in a film thickness direction exists in the second film.

5. The device of claim 4, wherein a film thickness of the second film is about 5 nm, and that of the region is not less than 2 nm.

6. The device of claim 1, wherein the metal comprises a transition metal element.

7. The device of claim 6, wherein the transition metal element is an element selected from the group consisting of Ni, Co, Al, Ti, Hf, Zr, and Ta.

8. The device of claim 1, wherein a film thickness of the second film is not more than 5 nm.

9. The device of claim 1, wherein one of the electrodes is an anode, and the other electrode is a cathode.

* * * * *